(12) United States Patent
Khamehchi

(10) Patent No.: US 12,245,409 B2
(45) Date of Patent: Mar. 4, 2025

(54) ELECTROMAGNETIC SHIELD FOR A SEALING MECHANISM OF A LASER CHAMBER

(71) Applicant: Cymer, LLC., San Diego, CA (US)

(72) Inventor: Mohammad Amin Khamehchi, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 18/026,874

(22) PCT Filed: Aug. 27, 2021

(86) PCT No.: PCT/US2021/047881
§ 371 (c)(1),
(2) Date: Mar. 17, 2023

(87) PCT Pub. No.: WO2022/072088
PCT Pub. Date: Apr. 7, 2022

(65) Prior Publication Data
US 2023/0320047 A1    Oct. 5, 2023

Related U.S. Application Data

(60) Provisional application No. 63/084,746, filed on Sep. 29, 2020.

(51) Int. Cl.
H05K 9/00 (2006.01)
H01S 3/038 (2006.01)
H01S 3/10 (2006.01)
H01S 3/225 (2006.01)

(52) U.S. Cl.
CPC .......... H05K 9/0015 (2013.01); H01S 3/0382 (2013.01); H01S 3/10092 (2013.01); H01S 3/225 (2013.01); H05K 9/0075 (2013.01)

(58) Field of Classification Search
CPC .................................................. H05K 9/0015
See application file for complete search history.

(56) References Cited

U.S. PATENT DOCUMENTS

| 4,959,840 A | 9/1990 | Akins et al. |
| 6,480,517 B1 | 11/2002 | Strowitzki et al. |
| 6,661,826 B2 | 12/2003 | Ujazdowski et al. |

(Continued)

FOREIGN PATENT DOCUMENTS

| JP | H05327064 A | 12/1993 |
| JP | H06152013 A | 5/1994 |

(Continued)

OTHER PUBLICATIONS

Anna Cortona, European Patent Office International Searching Authority, International Search Report and Written Opinion, corresponding PCT Application No. PCT/US2021/047881, mailed Dec. 9, 2021, 19 pages total.

*Primary Examiner* — Hung V Ngo
(74) *Attorney, Agent, or Firm* — DiBerardino McGovern IP Group LLC

(57) ABSTRACT

An apparatus for a light source includes: an electrical insulator that defines a channel; a gasket that surrounds at least a portion of the electrical insulator; and a shield between the channel and the gasket. The channel is configured to receive an electrical conductor. The gasket includes a non-metallic material.

29 Claims, 12 Drawing Sheets

(56) References Cited

U.S. PATENT DOCUMENTS

| | | | |
|---|---|---|---|
| 7,317,196 | B2 | 1/2008 | Partlo et al. |
| 7,456,634 | B2 * | 11/2008 | Knott .................... H01J 41/04 |
| | | | 313/240 |
| 2002/0196830 | A1 | 12/2002 | Ujazdowski et al. |
| 2005/0083984 | A1 | 4/2005 | Bragin et al. |
| 2009/0230326 | A1 | 9/2009 | Vaschenko et al. |
| 2009/0296755 | A1 | 12/2009 | Brown et al. |
| 2016/0365696 | A1 | 12/2016 | Tsushima et al. |

FOREIGN PATENT DOCUMENTS

| | | |
|---|---|---|
| JP | H11135984 A | 5/1999 |
| JP | 2002344187 A | 11/2002 |
| JP | 2009514246 A | 4/2009 |
| JP | 2019117792 A | 7/2019 |
| TW | 200944061 A | 10/2009 |

* cited by examiner

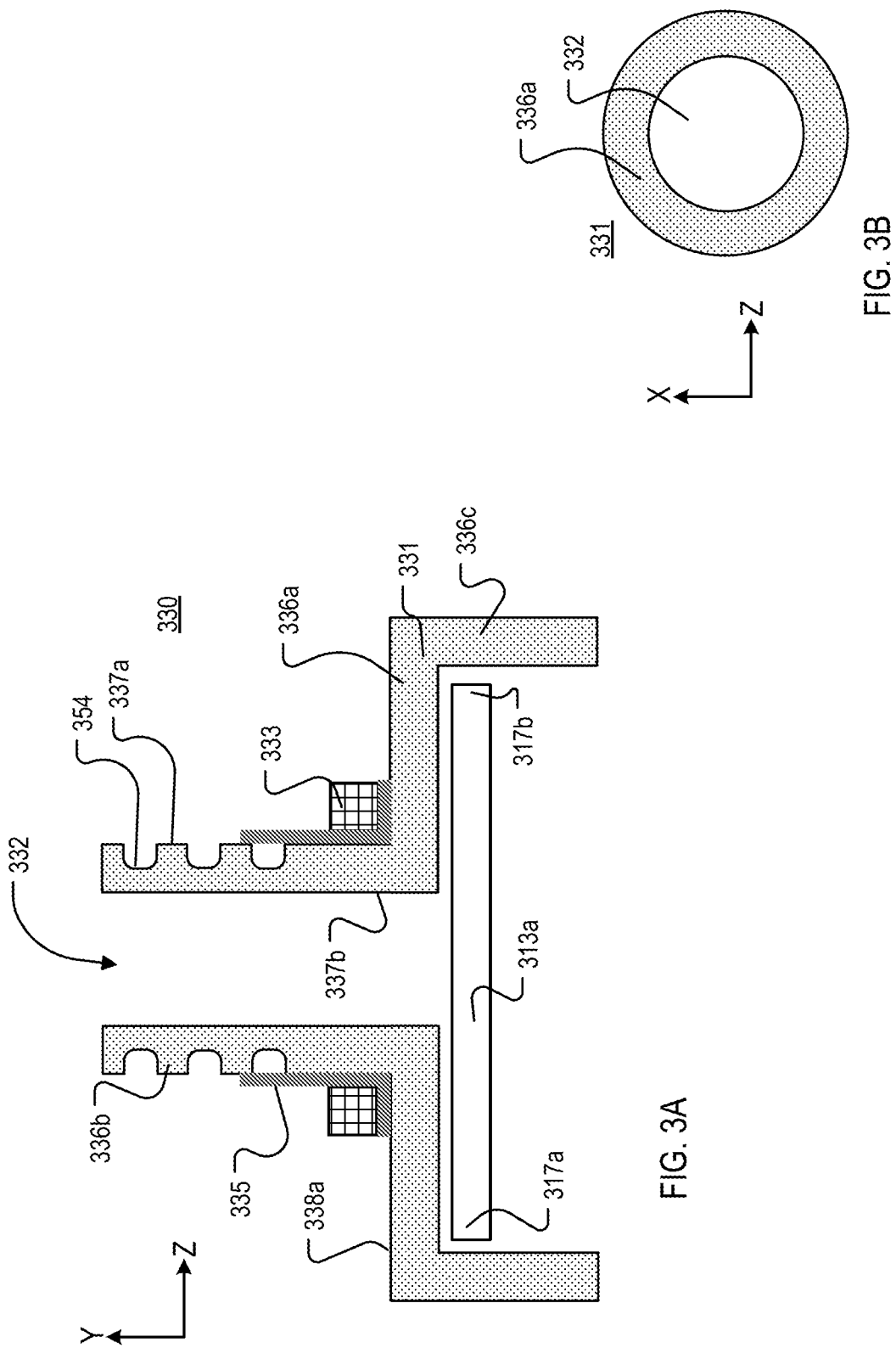

ELECTROMAGNETIC SHIELD FOR A SEALING MECHANISM OF A LASER CHAMBER

CROSS REFERENCE TO RELATED APPLICATIONS

This application claims priority to U.S. Application No. 63/084,746, filed Sep. 29, 2020, titled ELECTROMAGNETIC SHIELD FOR A SEALING MECHANISM OF A LASER CHAMBER, which is incorporated herein in its entirety by reference.

TECHNICAL FIELD

This disclosure relates to an electromagnetic shield for a sealing mechanism of a laser chamber. The laser chamber may be part of an excimer laser, for example, an excimer laser that is used in a deep ultraviolet (DUV) optical system.

BACKGROUND

Photolithography is the process by which semiconductor circuitry is patterned on a substrate such as a silicon wafer. A photolithography optical source (or light source) provides the deep ultraviolet (DUV) light used to expose a photoresist on the wafer. One type of gas discharge light source used in photolithography is known as an excimer light source or laser. An excimer light source typically uses a combination of one or more noble gases, such as argon, krypton, or xenon, and a reactive such as fluorine or chlorine. The excimer light source derives its name from the fact that under the appropriate condition of electrical stimulation (energy supplied) and high pressure (of the gas mixture), a pseudo-molecule called an excimer is created, which only exists in an energized state and gives rise to amplified light in the ultraviolet range. An excimer light source produces a light beam that has a wavelength in the deep ultraviolet (DUV) range and this light beam is used to pattern semiconductor substrates (or wafers) in a photolithography apparatus. The excimer light source can be built using a single gas discharge chamber or using a plurality of gas discharge chambers.

SUMMARY

In one aspect, an apparatus for a light source includes: an electrical insulator that defines a channel; a gasket that surrounds at least a portion of the electrical insulator; and a shield between the channel and the gasket. The channel is configured to receive an electrical conductor. The gasket includes a non-metallic material.

Implementations may include one or more of the following features.

The shield may be configured to reduce a magnetic field produced by an electrical current in the electrical conductor. The shield may be configured to block the magnetic field such that substantially no electric field is present near the gasket.

The shield may include a magnetic metal.

The shield may include a mu-metal.

The gasket may include an elastomer material.

The electrical insulator may include a base portion and a stem portion that extends from the base portion, and the channel may pass through the stem portion and the base portion. The shield may surround a portion of an outer side of the stem portion. The stem portion may be a cylinder, the channel may pass through the cylinder, and the base portion may extend orthogonally from the stem portion. The channel may be concentric with the cylinder, and the base portion may be concentric with the cylinder.

The electrical insulator may be a substantially cylindrical body, and the shield may surround a portion of an outer side of the cylindrical body.

The shield may include a ferrite or an iron alloy.

In another aspect, a discharge chamber includes: a housing; an electrode in the housing; an electrical conductor that passes through the housing and is electrically connected to the electrode; an electrical insulator that surrounds a portion of the electrical conductor; a gasket that surrounds the electrical insulator; and a shield around the electrical insulator. The shield is configured to block or attenuate a magnetic field.

Implementations may include one or more of the following features.

The shield may be disposed between the electrical insulator and the gasket.

The gasket may include an electrically insulating material. The electrically insulating material may include an elastomer. The gasket may include an O-ring.

The housing may include an inner wall, and the inner wall may include an electrically conductive material.

The discharge chamber may further include a second electrode in the housing. The housing may be configured to contain a gaseous gain medium. The gaseous gain medium may include fluorine. The gasket may include a fluorinated material.

The shield may be configured to block or attenuate a transient magnetic field produced by a time-varying electrical current that flows in the electrical conductor.

The discharge chamber may include: N electrical insulators; N gaskets; and N electrical conductors, where N is an integer number greater than one. Each of the N electrical insulators may surround one of the electrical conductors, each of the N gaskets may surround one of the N electrical insulators, and at least one of the N gaskets may be entirely metallic.

The discharge chamber may be configured for use in an deep ultraviolet (DUV) light source.

In some implementations, the gasket is in a groove, and the shield is between the electrical insulator and the groove.

In another aspect, a deep ultraviolet (DUV) light source includes a first chamber configured to produce a first pulsed DUV light beam. The first chamber includes: a first housing; a first electrode assembly in the first housing; a first insulator including a first channel configured to receive a first electrical conductor; a first gasket that surrounds a portion of the first insulator; and a first shield that surrounds a portion of the first channel. The first electrical conductor is configured to electrically connect to the first electrode assembly. The first shield is configured to block or attenuate magnetic fields.

Implementations may include one or more of the following features.

The DUV light source may further include a second chamber configured to produce a second pulsed DUV light beam. The second chamber may include: a second housing; a second electrode assembly in the second housing; a second insulator including a second channel configured to receive a second electrical conductor; a second gasket that surrounds a portion of the second insulator; and a second shield that surrounds a portion of the second channel. The second electrical conductor may be configured to electrically connect to the second electrode assembly. The first shield may be configured to block or attenuate magnetic fields. The first shield may be concentric with the first gasket, and the second shield may be concentric with the second gasket. The first pulsed light beam may include a seed light beam, the second chamber may be positioned to receive the seed light beam, and the second pulsed light beam may be based on the seed light beam. The first pulsed light beam and the second pulsed light beam may be emitted toward a common beam combiner. The first gasket and the second gasket may include an elastomer material. The first electrode assembly may include a first anode and a first cathode, and the first electrical conductor may be configured to electrically connect to the first cathode. The second electrode assembly may include a second anode and a second cathode, and the second electrical conductor may be configured to electrically connect to the second cathode.

The DUV light source may further include a power supply external to the first housing. The power supply may be configured to electrically connect to the electrical conductor, and, in operational use, the power supply may provide a high-voltage excitation pulse to the electrical conductor.

In some implementations, the first shield is concentrically disposed between the first gasket and the first insulator and the second shield is disposed concentrically between the second gasket and the first insulator.

In another aspect, a method of operating a laser includes: providing a shield between an insulator and a component, the insulator passing through a wall of a discharge chamber of the laser and defining a channel; placing an electrical conductor in the channel; and conducting a time-varying current in the electrical conductor to charge an electrode in the discharge chamber of the laser. The shield blocks a magnetic field formed around the electrical conductor such that substantially no electric field is present near the component.

Implementations may include one or more of the following features.

The component may include an elastomer gasket.

The method may further include providing a gaseous gain medium to the discharge chamber. The component may be a gasket configured to seal the chamber and prevent the gaseous gain medium from escaping the chamber. The shield may block a magnetic field formed around the electrical conductor such that substantially no electric field is present near the component and substantially no plasma of the gaseous gain medium is formed at the component.

In another aspect, a light source includes: a discharge chamber; an electrode in the discharge chamber; an electrically insulating structure including a base portion in the discharge chamber, the base portion extending between the electrode and an external wall of the discharge chamber, and a plurality of stem portions extending from the base portion and through the external wall of the discharge chamber; a plurality of gaskets, each gasket surrounding one of the stem portions, and at least one of the gaskets including a non-metallic material that surrounds a respective one of the stem portions; and a shield disposed between each of the at least one non-metallic gaskets and the respective one of the stem portions. Each stem portion includes a channel that passes through the stem portion and the base portion, and each channel is configured to receive an electrical conductor that electrically connects to the electrode.

Implementations may include one or more of the following features.

The plurality of gaskets may include at least one metallic gasket, and each of the at least one metallic gaskets may surround a respective one of the stem portions without a shield between the metallic gasket and the respective one of the stem portions.

Implementations of any of the techniques described above may include a system, a method, a process, a device, or an apparatus. The details of one or more implementations are set forth in the accompanying drawings and the description below. Other features will be apparent from the description and drawings, and from the claims.

DRAWING DESCRIPTION

FIG. 3A is a side cross-sectional block diagram of another example of an apparatus.

FIG. 3B is a top cross-sectional block diagram of an insulator that is included in the apparatus of FIG. 3A.

Various implementations are described below with reference to the drawings. In the description below, specific details are set forth to promote an understanding of the various implementations. Any implementation discussed below may be practiced without the specific details.

DETAILED DESCRIPTION

Figure 1A:
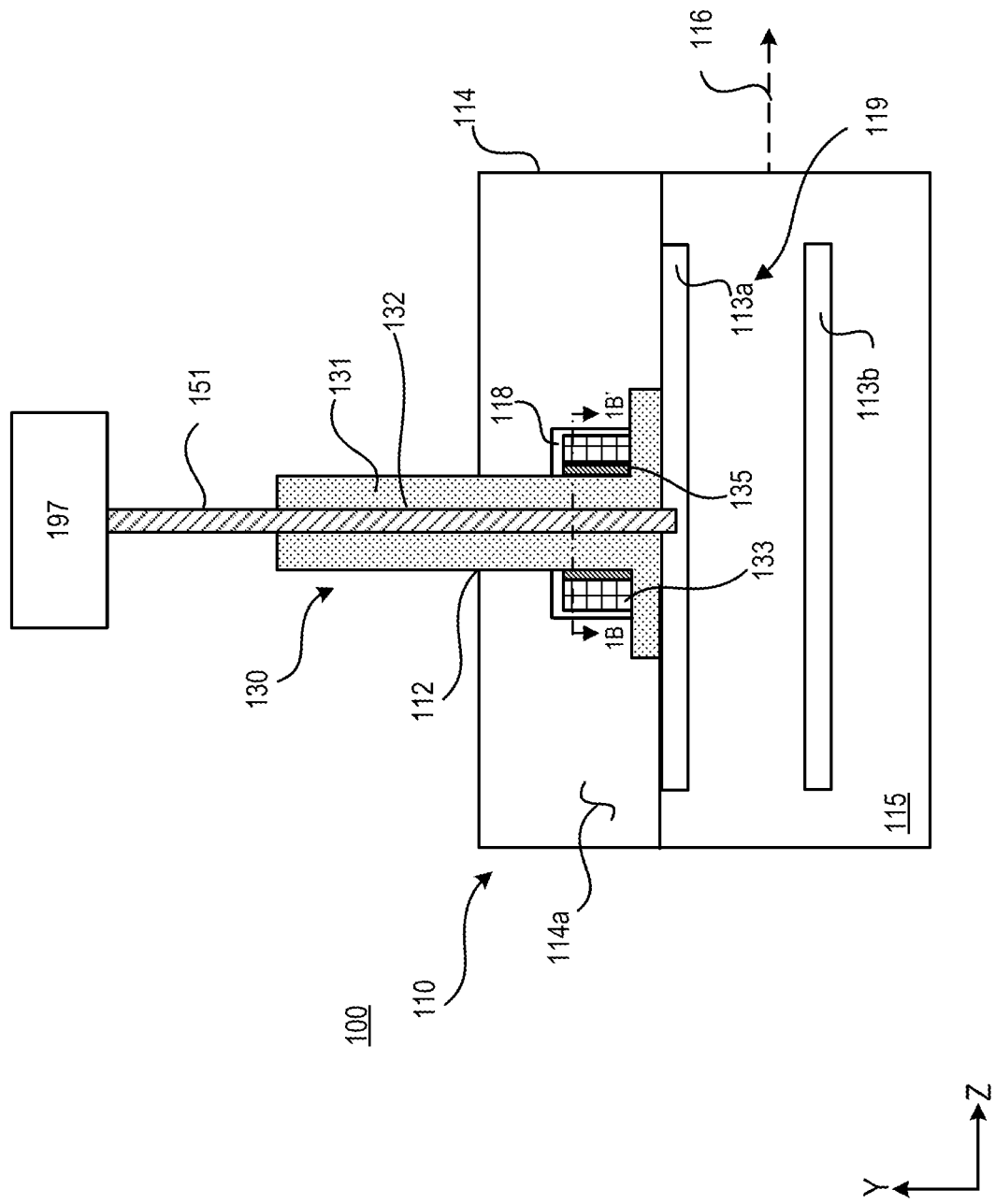
FIG. 1A is a side cross-sectional block diagram of a light source that includes an example of an apparatus with a shield.

FIG. 1A is a side cross-sectional block diagram of a system 100 that includes a light source 110 and an apparatus 130 for the light source 110. FIG. 1B is a cross-sectional view of the apparatus 130 along the line 1B-1B' of FIG. 1A. The apparatus 130 includes a shield 135 that protects a gasket 133 from degradation.

The apparatus 130 receives a conductor 151 that delivers electrical current to an electrode 113a in the light source 110. The apparatus 130 includes an insulator 131 (shown with dotted shading), the gasket 133 (shown with crossed-line shading), and the shield 135 (shown with dark gray shading). The shield 135 blocks or attenuates a transient or time-varying magnetic field that arises from the delivery of the electrical current. The light source 110 includes a discharge chamber 115 that contains a gas mixture 119. The gasket 133 seals the discharge chamber 115 such that the gas mixture 119 remains in the discharge chamber 115.

The gasket 133 is any type of sealing mechanism and may be, for example, an O-ring or a C-ring. The gasket 133 includes a non-metallic material. The non-metallic material is any type of material that is not metallic. For example, the gasket 133 may be made of a rubber or elastomer material, such as, for example, VITON™, available from DuPont Corporation of Wilmington, Delaware. The gasket 133 may include other compounds or materials that are introduced into the non-metallic material that forms gasket 133 during manufacture. For example, the gasket 133 may be a fluorinated material, such as a fluorinated rubber. Although the gasket 133 includes a non-metallic material, the gasket 133 may also include metal. For example, the gasket 133 may be a material that is generally electrically insulating that is coated with an electrically conductive material. In these implementations, the gasket 133 may be a rubber gasket that is coated with a thin layer of metal. The non-metallic material in the gasket 133 is more mechanically flexible than the metals that are typically used for gaskets.

The relative flexibility of the non-metallic material results in the gasket 133 being more robust and more adaptable when exposed to thermal stress as compared to a metal gasket. However, the non-magnetic material is also more susceptible to plasma damage. The transient magnetic field produced by the delivered electrical current creates an inductive electric field that may form plasma from the gas mixture 119. Although a metallic gasket is generally resistant to corrosion from this plasma, the non-metallic material of the gasket 133 is not as resistant and may be damaged and degraded by exposure to the plasma. If the gasket 133 fails or degrades, the gas mixture 119 may leak from the discharge chamber 115. The gas mixture 119 may include components (for example, fluorine) that produce dangerous or otherwise unfavorable conditions in the presence of gases, such as oxygen, that are ordinarily found in the atmosphere. Moreover, even in instances in which the gas mixture 119 does not include components that cause unfavorable conditions in the presence of gases ordinarily found in the atmosphere, loss of the gas mixture 119 reduces the performance of the light source 110.

The shield 135 blocks or attenuates the transient magnetic field that arises from conducting electrical current in the conductor 151. By blocking or attenuating the transient magnetic field, the shield 135 protects the gasket 133, thereby ensuring safe and efficient operation of the light source 110 and improving the overall performance of the light source 110.

In greater detail, the discharge chamber 115 encloses the electrode 113a, an electrode 113b, and the gas mixture 119. The gas mixture 119 includes a gain medium formed from, for example, a noble gas and a halogen gas. The apparatus 130 includes an electrical insulator 131 that passes through an opening 112 in a wall 114 of the discharge chamber 115. The wall 114 is made of a mechanically robust material. For example, the wall may be made of a mechanically robust metal material, such as, for example, aluminum, aluminum coated with nickel, or aluminum coated with another metallic material; a ruggedized polymer; or a mechanically robust metal material with a ruggedized polymer exterior. The opening 112 is sealed with the gasket 133, which is seated in a groove 118. The groove 118 is a recess, slot, or other open region that accommodates the gasket 133. The groove 118 may be formed in any manner. For example, the groove 118 may be formed in a metallic interior portion 114a of the wall 114. In another example, the groove 118 may be formed from a solid metallic wall that is separate from the interior portion 114a and separate from the wall 114. At least part of the gasket 133 is inside the discharge chamber 115, and the gasket 133 surrounds the electrical insulator 131. The insulator 131 is made of any type of electrically insulating material. For example, the insulator 131 may be made of aluminum oxide ($Al_2O_3$).

The electrical insulator 131 defines a channel 132 that passes through the electrical insulator 131 and accommodates a conductor 151. The conductor 151 is electrically connected to a power supply 197 and to the electrode 113a. The electrodes 113a and 113b are made of an electrically conductive material, such as, for example, a metal or a metal alloy. For example, the electrodes 113a and 113b may be made of an alloy of copper and zinc. One of the electrodes 113a and 113b is an anode and the other of the electrodes 113a and 113b is a cathode. In the example of FIG. 1A, the electrode 113a is the cathode and the electrode 113b is the anode. In other implementations, the electrode 113a is the anode and the electrode 113b is the cathode.

In operational use of the light source 110, the power supply 197 provides a time-varying electrical current to the electrode 113a via the conductor 151. The electrode 113b is held at a constant voltage (for example, the electrode 113b may be grounded). Thus, charging the electrode 113a creates a potential difference and an electric field between the electrodes 113a and 113b.

Figure 1C:
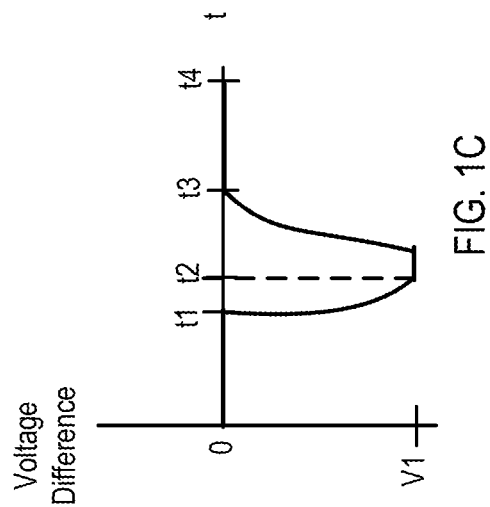
FIG. 1C is an example of a potential difference between electrodes of the light source of FIG. 1A over time.
Figure 1B:
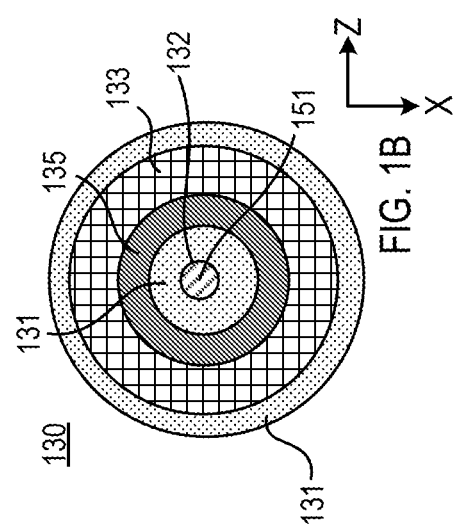
FIG. 1B is a cross-sectional top block diagram of the apparatus of FIG. 1A.

FIG. 1C is a plot of an example of the potential difference between the electrodes 113a and 113b over a charge cycle that produces a single pulse of light of a pulsed output light beam 116. Between times t0 and t1, no current is provided to the electrode 113a, and the voltage difference between the electrodes 113a and 113b is 0 volts (V). Between time t1 and time t2, the power supply 197 supplies a large amount of electrical current (for example, hundreds or thousands of amperes) to the electrode 113a. The electrical charge on the electrode 113a accumulates, and the voltage difference between the electrode 113a and the electrode 113b changes from 0 V to V1. When the voltage difference reaches V1 at time t2, the electric field between the electrodes 113a and 113b is sufficient to cause population inversion in the gain medium of the gas mixture 119, and a pulse of light is produced. The power supply 197 stops supplying electrical current, and the voltage differential between the electrodes 113a and 113b decreases from V1 to 0 V, and is 0V again at time t3. The potential difference between the electrode 113a and 113b remains at 0V between time t3 and time t4. Repeating the charge cycle produces another pulse of light. By repeating the charge cycle many, pulses of light separated from each other in time are formed and the pulsed light beam 116 is generated The electric charge on the electrode 113a creates a capacitive electric field between the electrode 113a and the metallic interior portion 114a of the wall 114 chamber 115, as shown by Equation 1 (which is one of Maxwell's equations):

$$\nabla \cdot \vec{E} = \rho/\varepsilon_0 \qquad \text{Equation (1),}$$

where E represents the electric field, ρ is the total charge per unit volume on the electrode 113a, and $\varepsilon_0$ is the permittivity of free space. In addition to the capacitive electric field, an inductive electric field arises from the delivery of the electrical current to the electrode 113a via the conductor 151. During a charge cycle, electrical current flows in the conductor 151 for only a very small amount of time. For example, in the charge cycle shown in FIG. 1C, electrical current only flows in the conductor 151 between the times t1 and t2. The amount of time between the times t1 and t2 is relatively small (for example, a few nanoseconds or tens of nanoseconds). During the rest of the charge cycle, electrical current does not flow in the conductor 151. Thus, the electrical current is not constant throughout the charge cycle and is a time-varying electrical current. The electrical current therefore produces a time-varying magnetic field.

The time-varying magnetic field produces an inductive electric field, as shown in Equation 2 (which is another one of Maxwell's equations):

$$\nabla \times \vec{E} = -\frac{\partial \vec{B}}{\partial t}, \quad \text{Equation (2)}$$

where E represents the electric field and B represents the magnetic field. Furthermore, the curl of the magnetic field found in Equation (2) is related to the electric field as shown in Equation 3 (which is another one of Maxwell's equations):

$$\nabla \times \vec{B} = \mu_0 \vec{J} + \frac{1}{c^2}\frac{\partial \vec{E}}{\partial t}, \quad \text{Equation (3)}$$

where $\mu_0$ is the permeability of free space, c is the speed of light, J is the total current per unit area, and E is the electric field. For example, if 1000 amperes (A) of current is provided to the electrode 113a over a few nanoseconds, the electric field produced will be hundreds to thousands of volts (V) per meter (m), and the magnetic field at the gasket 133 will be about 500 Gauss (G). The inductive electric field (which is caused by the transient magnetic field) may cause the gas mixture 119 to ionize or form plasma, which may damage the gasket 133.

The material in which the groove 118 is formed is a mechanically robust material (such as aluminum) that does not completely shield the gasket 133 from the time-varying magnetic field or does not shield the gasket 133 from the time-varying magnetic field at all. On the other hand, the apparatus 130 includes the shield 135, which surrounds the conductor 151 and suppresses or eliminates the time-varying magnetic field. By suppressing or eliminating the time-varying magnetic field, the shield 135 also reduces or eliminates the inductive electric field and reduces or eliminates the production of plasma that may damage the gasket 133.

The shield 135 is made of any type of material that is capable of providing magnetic shielding. For example, the shield 135 may be made of a high-permeability metal. Permeability (µ) is a measure of a material's resistance to the formation of a magnetic field or the degree of magnetization that the material obtains in response to an applied magnetic field. The shield 135 may be made of a metal material with a relatively small skin depth. Skin depth is the depth at which an incident electromagnetic wave has been reduced by 1/e. Materials with high permeability also tend to have a small skin depth. Using a material with a small skin depth for the shield 135 reduces the size of the shield. Examples of materials that may be used for the shield include, for example, Mu-metal (which is an alloy of nickel and iron), an alloy made of cobalt and iron, an alloy made of silicon and iron, pure iron, steel 410, permalloy, and Metglas 2714A (annealed).

Moreover, the shield 135 is an element that is made of a material that is not necessarily as mechanically robust as the material in which the groove 118 is formed. Many materials that have a high permeability and offer the most magnetic shielding are not mechanically robust and would not be suitable for use as the groove 118 or the wall 114. Accordingly, the shield 135 allows the groove 118 and the wall 114 to be made of a mechanically robust material while also providing magnetic shielding to the gasket 133.

Figure 2D:
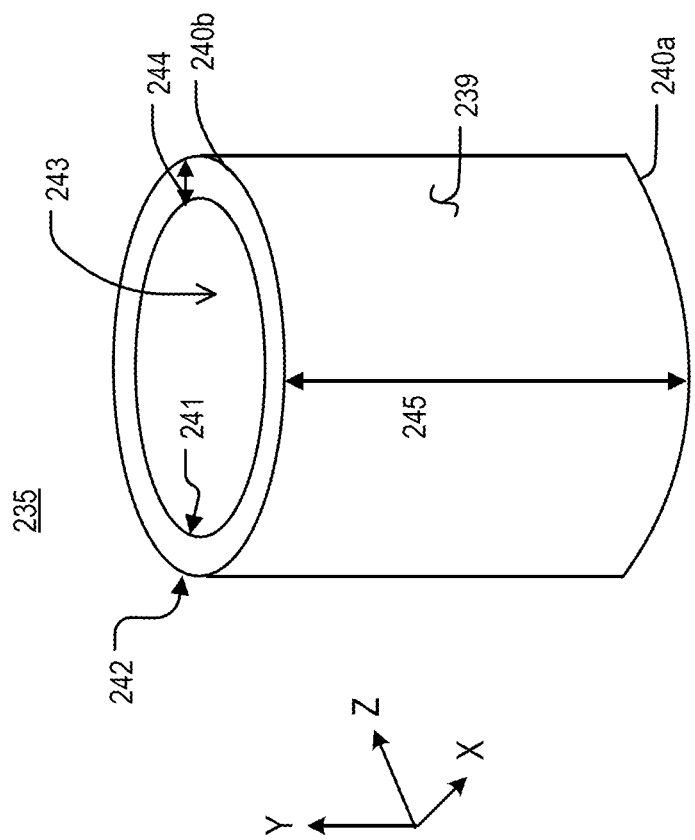
FIG. 2D is a perspective block diagram of a shield that is included in the apparatus of FIG. 2A.
Figure 3C:
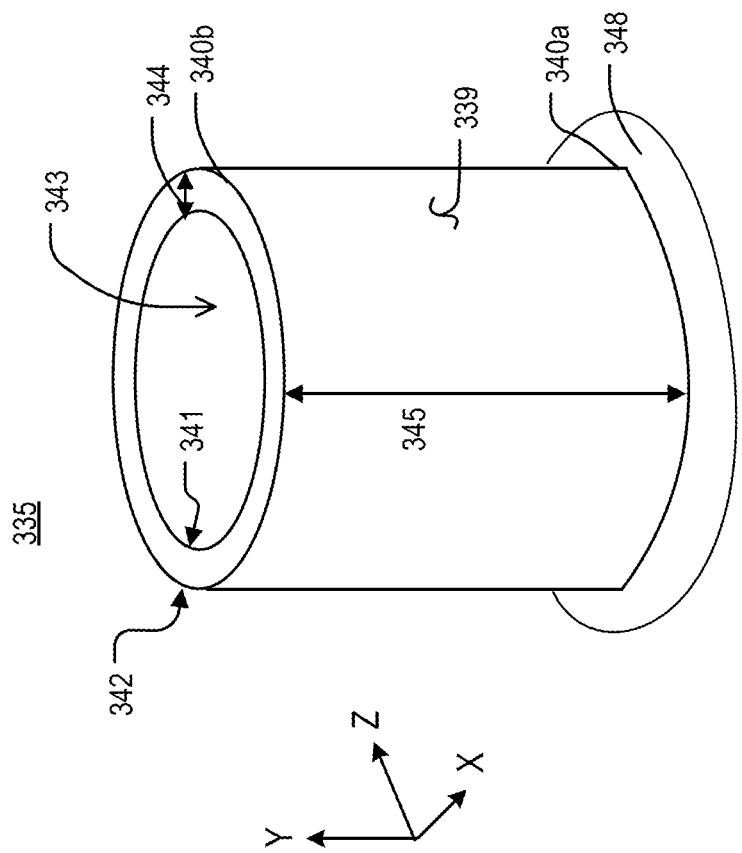
FIG. 3C is a perspective block diagram of a shield that is included in the apparatus of FIG. 3A.

Although the shield 135 is an element that is in addition to the groove 118 and is made of a different material than material in which the groove 118 is formed, the shield 135 may take a variety of forms. For example, the shield 135 may be a separate structure that is formed as a three-dimensional object and then seated into the groove 118 during assembly of the light source 110 or during an upgrade or retro-fit of the light source 110. FIGS. 2D and 3C show examples of such a three-dimensional object. In other implementations, the material of the shield 135 is coated onto a portion of the groove 118 that is between the gasket 133 and the insulator 131.

Figure 1D:
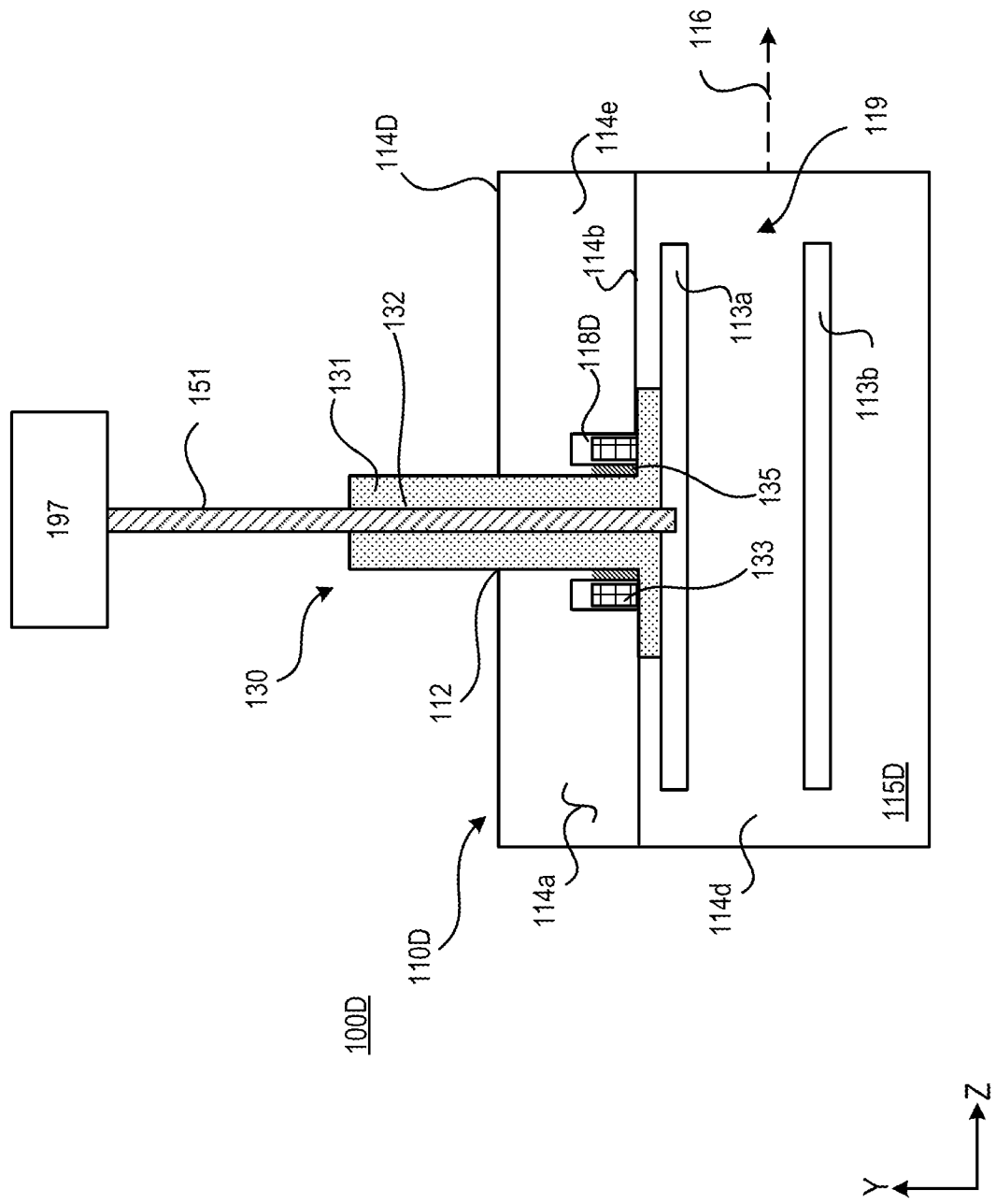
FIG. 1D is a side cross-sectional block diagram of another example of a light source that includes an example of an apparatus with a shield.
Figure 4:
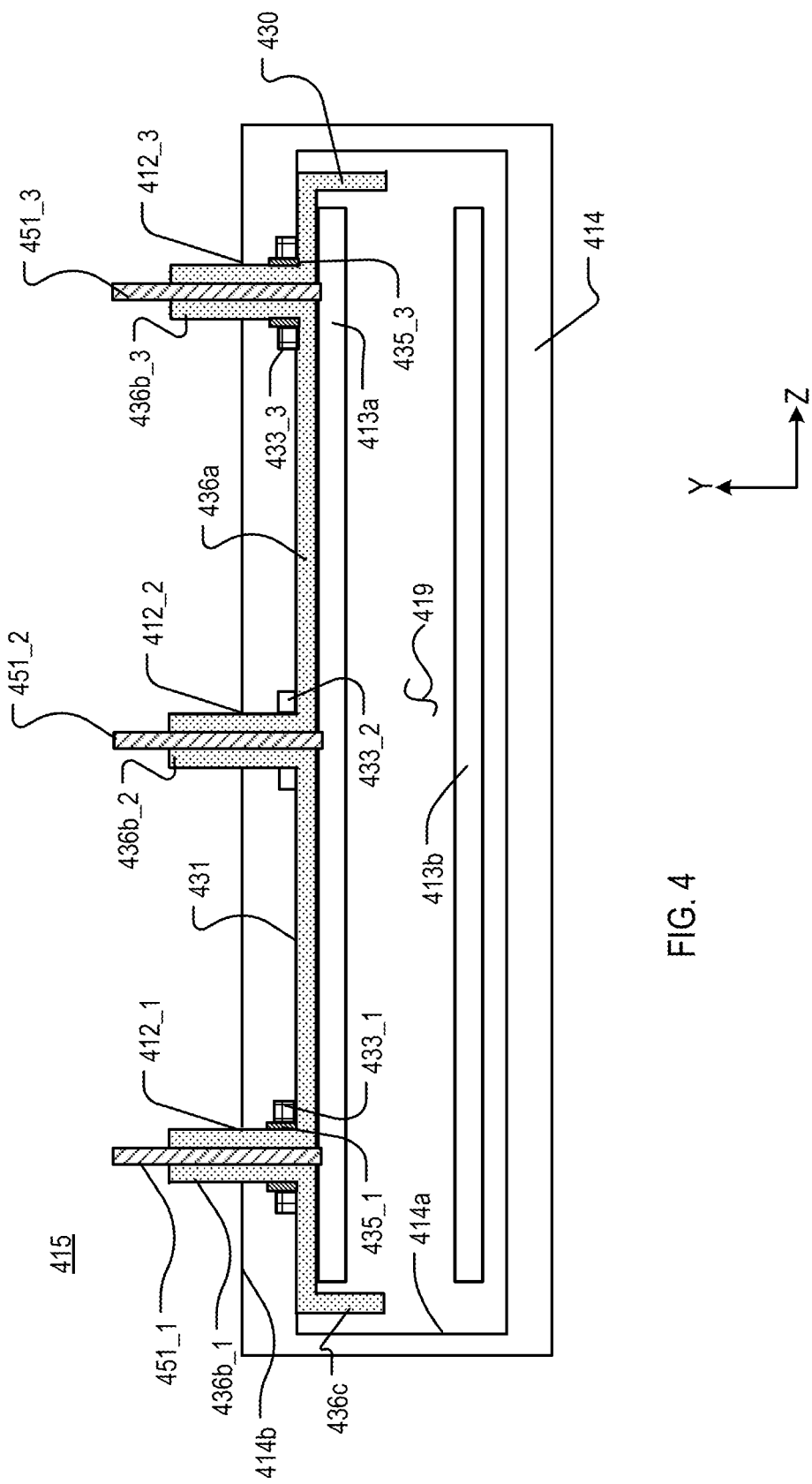
FIG. 4 is a side cross-sectional block diagram of another example of a light source.

Moreover, the groove 118 may take other forms, and the shield 135 may be placed in a configuration other than shown in FIG. 1A. For example, the shield 135 may be outside of the groove 118 but still between the conductor 151 and the gasket 133. FIG. 1D shows an example of such a configuration. Furthermore, the light source 110 may lack the groove 118. In these implementations, the gasket 133 may be bonded to the interior portion 114a directly without being seated in a groove such as the groove 118. FIG. 4 is an example of such an implementation.

Referring to FIG. 1D, a system 100D is shown. The system 100D includes a light source 110D. The light source 110D includes a discharge chamber 115D, which is similar to the discharge chamber 115 (FIG. 1A), except the discharge chamber 115D includes a first portion 114e and a second portion 114d. The electrodes 113a and 113b are inside chamber 115, in the second portion 114d. The discharge chamber 115D includes a surface 114b that extends generally in the X-Z plane between the first portion 114e and the second portion 114d. First portion 114e may be, for example, a plate or block of metal, such as aluminum. In the implementation shown in FIG. 1D, the gasket 133 is in a groove 118D. The groove 118D is an open region surrounded by a wall that extends in the Y direction from the surface 114b. The groove 118D accommodates the gasket 133 in the open region. The shield 135 is not in the open region of the groove 118D. However, the shield 135 is between the gasket 133 and the conductor 132, and the shield 135 also surrounds the insulator 131. Thus, regardless of the position of the shield 135 relative to the groove 118D, the shield 135 blocks or attenuates magnetic fields that may be generated during use of the optical source 110D.

Other implementations of the groove 118 and the groove 118D are possible, and the configurations shown in FIGS. 1A, 1D, and 4 are provided as examples. For example, the shield 135 may be placed in the groove 118D, or the groove 118D may be coated with the material used for the shield 135.

Figure 2A:
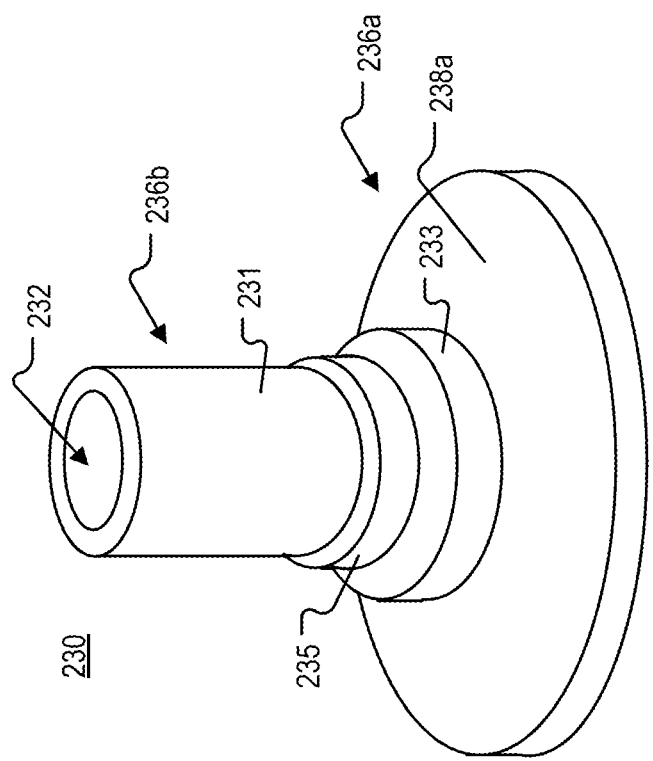
FIG. 2A is a perspective block diagram of another example of an apparatus.
Figure 2C:
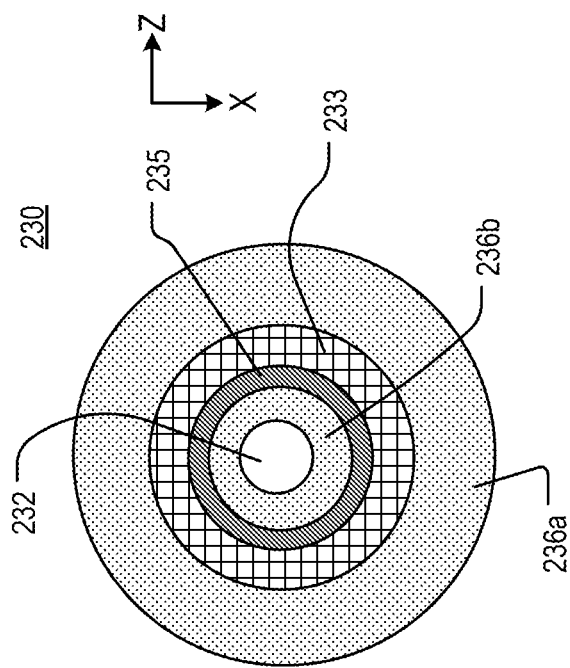
FIGS. 2B and 2C are side and top cross-sectional block diagrams, respectively, of the apparatus of FIG. 2A.
Figure 2B:
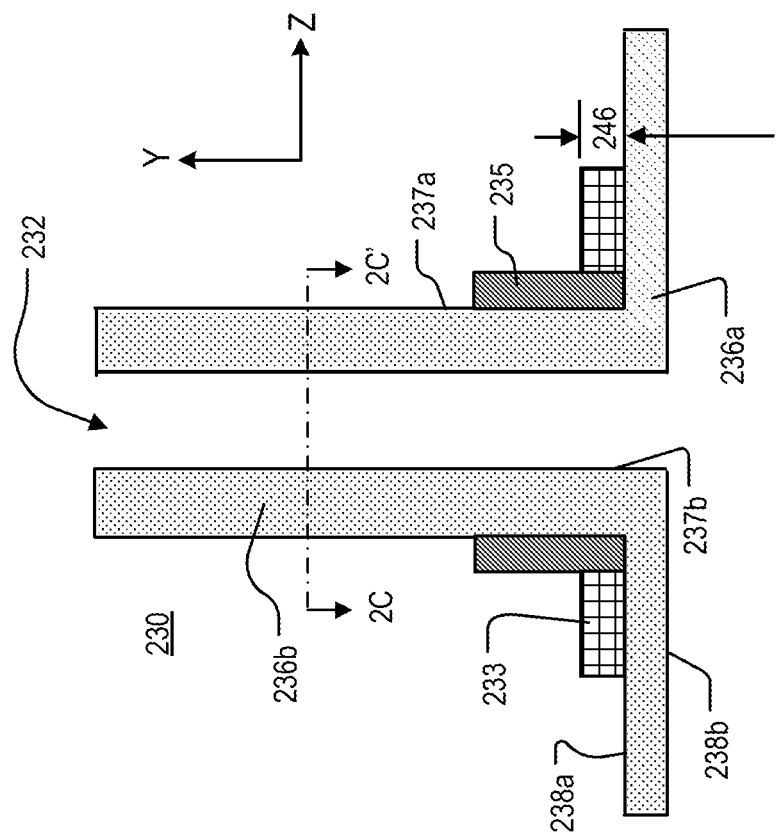
Figures 5A, 5B:
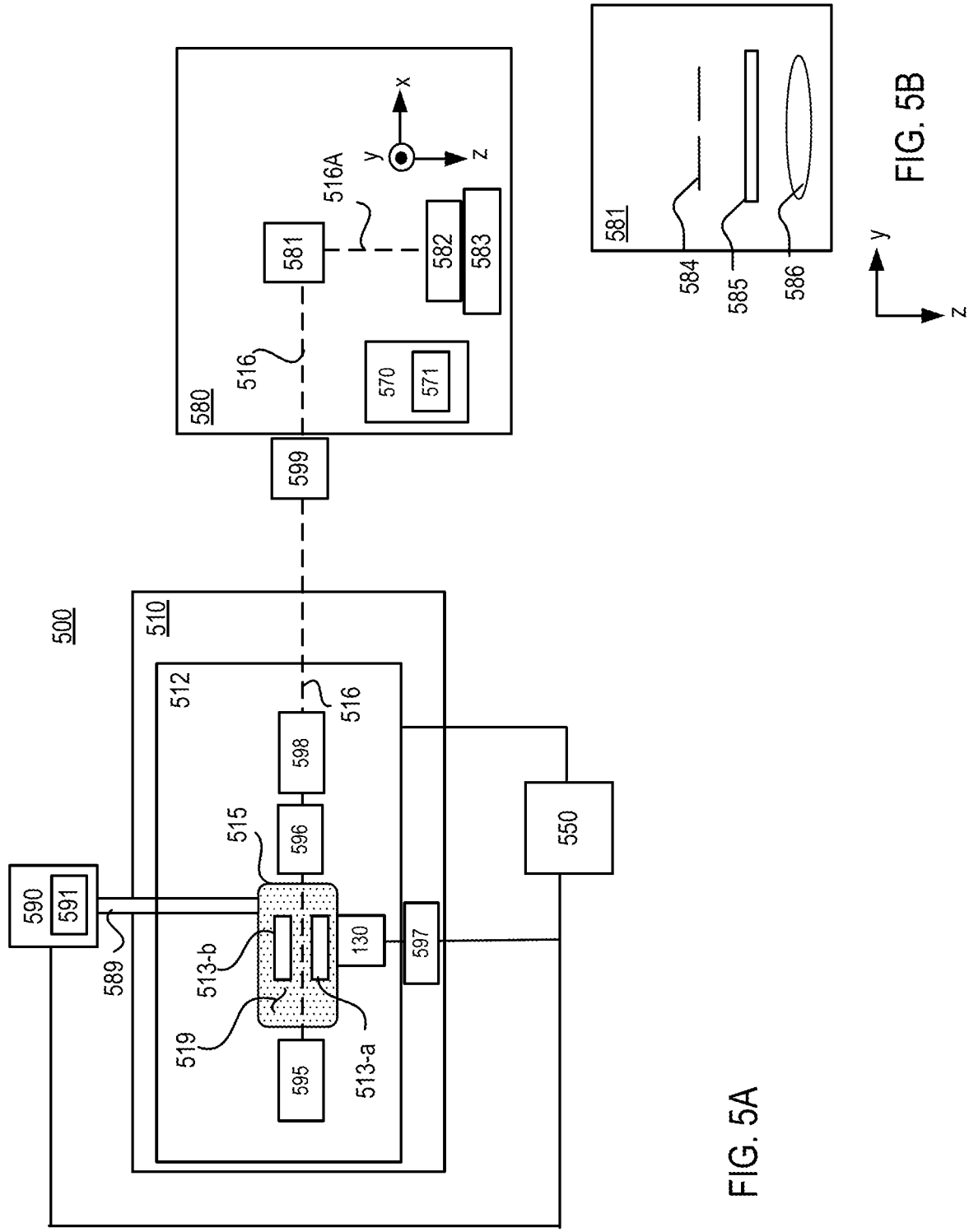
FIG. 5A is a block diagram of an example of a lithography system.
FIG. 5B is a block diagram of an example of a projection apparatus.
Figure 6:
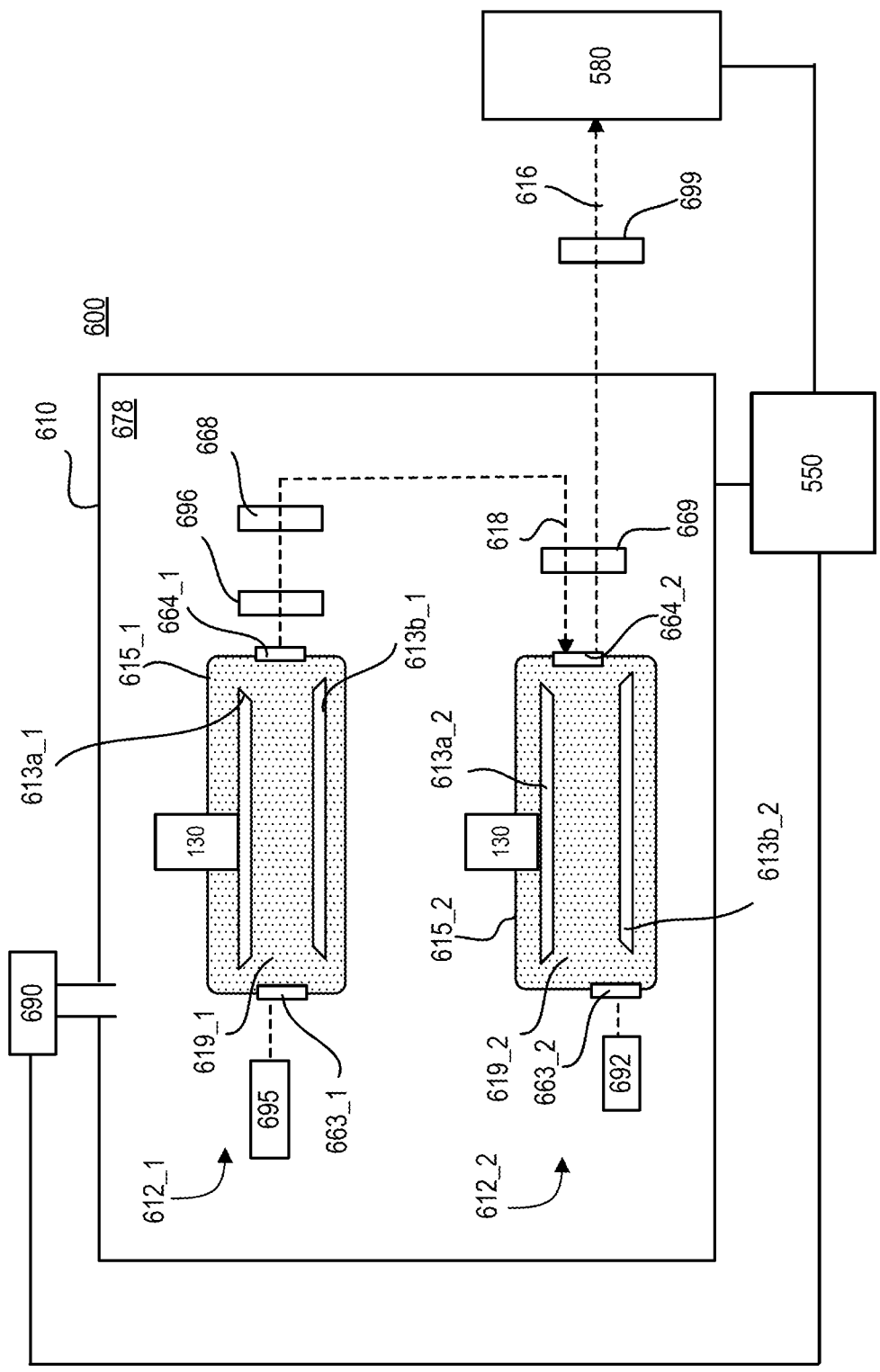
FIG. 6 is a block diagram of another example of a lithography system.

FIG. 2A is a perspective view of an apparatus 230. The apparatus 230 is an example of an implementation of the apparatus 130 (FIGS. 1A and 1B). The apparatus 230 may be used with the light source 110 or with a DUV light source such as shown in FIG. 5A or 6. FIG. 2B is a cross-sectional view of the apparatus 230 in the Y-Z plane. FIG. 2C is a cross-sectional view of the apparatus 230 taken along the line 2C-2C' of FIG. 2B.

The apparatus 230 includes an electrical insulator 231 (shown with dotted shading in FIGS. 2B and 2C), a gasket 233 (shown with crossed-line shading in FIGS. 2B and 2C), and a shield 235 (shown with solid gray shading in FIGS. 2B and 2C). The electrical insulator 231 includes a base portion 236a and a stem portion 236b that extends in the Y direction from the base portion 236a. The stem portion 236b is substantially cylindrical in shape. The stem portion 236b includes an outer wall 237a and an inner wall 237b. The inner wall 273b defines a channel 232 that passes through the electrical insulator 231. In operational use, the channel 232 receives an electrical conductor, such as the electrical conductor 151 (FIG. 1A). In the example of FIGS. 2A-2C, the channel 232 has a circular cross-section in the X-Z plane.

The base portion 236a is annular and extends generally in the X-Z plane. The base portion 236a includes a first side 238a and a second side 238b opposite the first side 238a. Referring also to FIG. 2D, which is a perspective view of the shield 235, the shield 235 includes a cylindrically shaped sidewall 239 that extends in the Y direction from a first end 240a to a second end 240b. The sidewall 239 includes an inner wall 241 that defines a passageway 243. The passageway 243 has an extent 245 in the Y direction. When the apparatus 230 is assembled (as shown in FIGS. 2A-2C), the inner wall 241 of the shield 235 surrounds the outer wall 237a of the stem portion 236b, and the end 240a rests on the first side 238a of the base portion 236a.

The shield 235 is made of a material that inhibits or blocks magnetic fields. For example, the shield 235 may be made of a magnetic or ferrous metal such as a mu-metal, iron, or an iron alloy. The sidewall 239 of the shield 235 has a thickness 244. The thickness 244 is the radial distance between the inner wall 241 and an outer wall 242. The thickness 244 is at least equal to the skin depth of the material of the shield 235. In some implementations, the extent 245 of the shield is at least twice the diameter of the passageway 243.

The apparatus 230 also includes the gasket 233. The gasket 233 may be made of a rubber or elastomer material. The gasket 233 has an annular shape and may be, for example, an O-ring or a C-ring. The gasket 233 rests on the first side 238a of the base portion 236a. The shield 235 is between the gasket 233 and the stem portion 236b. The gasket 233 has an extent 246 in the Y direction. In the example shown in FIG. 2C, the shield 235 is concentric with the channel 232 and is also concentric with the stem portion 236b. Furthermore, the gasket 233 has an annular shape and is concentric with the channel 232, the stem portion 236b, and the shield 235.

In operational use, the apparatus 230 is installed in a light source such as shown in FIG. 1A. The gasket 233 acts as a seal and the shield 235 protects the gasket 233 from plasma and/or electromagnetic fields created during operation of the light source. In the example shown in FIG. 2A, the extent 246 of the gasket 233 is smaller than the extent 245 of the shield. Such a configuration allows the shield 235 to more fully extinguish or block magnetic fields. However, other implementations are possible. For example, the extent 245 of the shield 235 may be equal to the extent 246 or less than the extent 246. Moreover, although a shield 235 with a greater extent 245 may eliminate a greater portion of the magnetic field produced during operational use, the extent 245 of the shield 235 is limited such that the shield 235 does not come into contact with metallic objects that carry electrical current or does not come close enough to such metallic objects to present a risk of arcing.

FIG. 3A is a cross-sectional view of an apparatus 330 and an electrode 313a. The apparatus 330 is another example implementation of the apparatus 130 (FIG. 1A). The apparatus 330 may be used with the light source 110 (FIG. 1A) or with another light source, such as those shown in FIGS. 5A and 6.

The apparatus 330 includes an insulator 331 (shown with dotted shading), a gasket 333 (shown with crossed-lined shading), and a shield 335 (shown in solid dark gray shading) between the insulator 331 and the gasket 333. The insulator 331 includes a base portion 336a, a stem portion 336b that extends in the Y direction from the base portion 336a, and a side portion 336c that extends in the -Y direction from the base portion 336a. Referring also to FIG. 3B, which shows the insulator 331 in the X-Z plane, the base portion 336a has an annular shape in the X-Z plane.

The stem portion 336b includes an outer wall 337a and an inner wall 337b. The inner wall 337b defines a channel 332. The outer wall 337a includes ridges 354 that encircle the stem portion 336b in the X-Z plane. The ridges 354 increase the surface distance of the outer wall 337a of the stem portion 336b in the Y direction as compared to an implementation that lacks the ridges 354. The increase in surface distance or surface path provides better electrical insulation and impedes surface tracking. Surface tracking refers to the formation of a continuous conducting paths across the surface of the insulator 331 due to surface erosion that may occur due to exposure to high voltages.

The side portion 336c extends from the base portion 336a in the -Y direction and provides insulation between ends 317a and 317b of the electrode 313a and the interior walls of a discharge chamber (such as the chamber 115 of FIG. 1A) that encloses the electrode 313a. The side portion 336c may have any shape in the X-Z plane. For example, the side portion 336c may have a circular shape, an elliptical shape, or a rectangular shape. The electrode 313a and side portion 336c may have the same shape in the X-Z plane, with the side portion 336c being large enough to surround the electrode 313a.

FIG. 3C is a perspective view of the shield 335. The shield 335 includes a cylindrically shaped sidewall 339 that extends in the Y direction from a first end 340a to a second end 340b, and a flange 348 that extends radially outward from the first end 340a in the X-Z plane. The sidewall 339 has a thickness 344. The flange 348 surrounds the first end 340a. In the example of FIGS. 3A and 3C, the flange 348 is a circle in the X-Z plane. The flange 348 has an extent in the Y direction, and the extent may be equal to or greater than the skin depth of the material used for the shield 335. The shield 335 is made of any type of material that suppresses or blocks magnetic fields. For example, the shield 335 may be made of a mu-metal or an iron alloy.

When the apparatus 330 is assembled (such as shown in FIG. 3A), the flange 348 is between a first side 338a of the base portion 336a of the insulator 331 and the gasket 333. The sidewall 339 of the shield 335 is between an outer wall 337a of the stem portion 336b and the gasket 333. The flange 348 may increase the amount of magnetic field that the shield 335 is able to block.

FIG. 4 is a side cross-sectional view of a discharge chamber 415 and an apparatus 430. The discharge chamber 415 includes a housing 414 that encloses an electrode 413a and an electrode 413b. The housing 414 also contains a gas mixture 419 that includes a gain medium. The electrode 413a may be a cathode, and the electrode 413b may be an anode. The discharge chamber 415 includes a housing 414 that has a metallic inner wall 414a, i.e. wall 414a is formed of an electrically conductive material.

The apparatus 430 includes an insulator 431 (shown with dotted shading). The insulator 431 includes a base portion 436a that extends in the X-Z plane between the electrode 413a and a top 414b of the inner wall 414a. The insulator 431 also includes a plurality of stem portions 436b_1, 436b_2, 436b_3 that extend from the base portion 436a in the Y direction. The stem portions 436b_1, 436b_2, 436b_3 pass through respective openings 412_1, 412_2, 412_3 in the top 414b. The gaskets 433_1, 433_2, 433_3 surround the respective stem portions 436b_1, 436b_2, 436b_3. The gaskets 433_1, 433_2, 433_3 seal the openings 412_1, 412_2, 412_3, respectively.

The gaskets 433_1 and 433_3 (shown with crossed-line shading) include a material that is not generally electrically conductive, such as rubber. The gasket 433_2 is made of a metal material. The stem portion 436b_1 is surrounded by a shield 435_1, and the stem portion 436b_3 is surrounded by a shield 435_3. The shields 435_1 and 435_3 are shown with dark gray shading. Each of the stem portions 436b_1 to 436b_3 defines a channel that surrounds a respective electrical conductor 451_1, 451_2, 451_3. Each of the electrical conductors 451_1, 451_2, 451_3 is electrically connected to the electrode 413a.

In operational use, the electrical conductors 451_1, 451_2, 451_3 deliver short pulses of electrical charge (for example, 1-100 nanoseconds) to the electrode 413a repeatedly over time to repeatedly excite the gain medium in the gas mixture 419 and to produce a pulsed light beam. The delivery of electrical charge causes the temperature of the housing 414; the insulator 431; the gaskets 433_1, 433_2, 433_3; and the electrodes 413a, 413b to change. These elements are made of different materials and have different thermal characteristics and experience different amounts of thermal expansion. In various embodiments, the center portion of the chamber 415 experiences the least amount of thermal expansion. The relatively low amount of thermal expansion in the center portion of the chamber 415 allows the gasket 433_2 to be a metal material.

The amount of thermal expansion may be greater at either end of the chamber 415, and the gaskets 433_1 and 433_3 include a non-metallic material, such as, for example, rubber, that does not experience a high amount of thermal expansion. However, the gaskets 433_1 and 433_3 may be damaged by plasma and thus each of the gaskets 433_1 and 433_3 is protected by the respective shield 435_1 and 435_3. The shields 435_1 and 435_3 are made of a material with a high permittivity. The shields 435_1 and 435_3 may be similar to the shield 235 or the shield 335 in shape.

FIGS. 5A and 6 show examples of deep ultraviolet (DUV) optical systems with which the apparatuses 130, 230, 330, or 430 may be used. FIGS. 5A and 6 are illustrated with the apparatus 130, but may use any of the apparatuses 230, 330, and 430. Referring to FIGS. 5A and 5B, a system 500 includes a light-generation module 510 that provides an exposure beam (or output light beam) 516 to a scanner apparatus 580. A control system 550 is also coupled to the light-generation module 510 and to various components associated with the light-generation module 510.

The light-generation module 510 includes an optical oscillator 512. The optical oscillator 512 generates the output light beam 516. The optical oscillator 512 includes a discharge chamber 515, which encloses a cathode 513-a and an anode 513-b. The discharge chamber 515 also contains a gaseous gain medium 519 (shown with light dotted shading in FIG. 5A). A potential difference between the cathode 513-a and the anode 513-b forms an electric field in the gaseous gain medium 519. The potential difference is generated by controlling a power supply 597 to provide electrical current to the cathode 513-a. The electric field provides energy to the gain medium 519 sufficient to cause a population inversion and to enable generation of a pulse of light via stimulated emission. Repeated creation of such a potential difference forms a train of pulses, which are emitted as the light beam 516. The repetition rate of the pulsed light beam 516 is determined by the rate at which voltage is applied to the electrodes 513-a and 513-b. The repetition rate of the pulses may range, for example, between about 500 and 6,000 Hz. In some implementations, the repetition rate may be greater than 6,000 Hz, and may be, for example, 12,000 Hz or greater. Each pulse emitted from the optical oscillator 512 may have a pulse energy of, for example, approximately 1 milliJoule (mJ).

The gaseous gain medium 519 may be any gas suitable for producing a light beam at the wavelength, energy, and bandwidth required for the application. The gaseous gain medium 519 may include more than one type of gas, and the various gases are referred to as gas components. For an excimer source, the gaseous gain medium 519 may contain a noble gas (rare gas) such as, for example, argon or krypton; or a halogen, such as, for example, fluorine or chlorine. In implementations in which a halogen is the gain medium, the gain medium also includes traces of xenon apart from a buffer gas, such as helium.

The gaseous gain medium 519 may be a gain medium that emits light in the deep ultraviolet (DUV) range. DUV light may include wavelengths from, for example, about 100 nanometers (nm) to about 400 nm. Specific examples of the gaseous gain medium 519 include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm.

A resonator is formed between a spectral adjustment apparatus 595 on one side of the discharge chamber 515 and an output coupler 596 on a second side of the discharge chamber 515. The spectral adjustment apparatus 595 may include a diffractive optic such as, for example, a grating and/or a prism, that finely tunes the spectral output of the discharge chamber 515. The diffractive optic may be reflective or refractive. In some implementations, the spectral adjustment apparatus 595 includes a plurality of diffractive optical elements. For example, the spectral adjustment apparatus 595 may include four prisms, some of which are configured to control a center wavelength of the light beam 516 and others of which are configured to control a spectral bandwidth of the light beam 516.

The spectral properties of the light beam 516 may be adjusted in other ways. For example, the spectral properties, such as the spectral bandwidth and center wavelength, of the light beam 516 may be adjusted by controlling a pressure and/or gas concentration of the gaseous gain medium of the chamber 515. For implementations in which the light-generation module 510 is an excimer source, the spectral properties (for example, the spectral bandwidth or the center wavelength) of the light beam 516 may be adjusted by controlling the pressure and/or concentration of, for example, fluorine, chlorine, argon, krypton, xenon, and/or helium in the chamber 515.

The pressure and/or concentration of the gaseous gain medium 519 is controllable with a gas supply system 590. The gas supply system 590 is fluidly coupled to an interior of the discharge chamber 515 via a fluid conduit 589. The fluid conduit 589 is any conduit that is capable of transporting a gas or other fluid with no or minimal loss of the fluid. For example, the fluid conduit 589 may be a pipe that is made of or coated with a material that does not react with the fluid or fluids transported in the fluid conduit 589. The gas supply system 590 includes a chamber 591 that contains and/or is configured to receive a supply of the gas or gasses used in the gain medium 519. The gas supply system 590 also includes devices (such as pumps, valves, and/or fluid switches) that enable the gas supply system 590 to remove gas from or inject gas into the discharge chamber 515. The gas supply system 590 is coupled to the control system 250.

The optical oscillator 512 also includes a spectral analysis apparatus 598. The spectral analysis apparatus 598 is a measurement system that may be used to measure or monitor the wavelength of the light beam 516. In the example shown in FIG. 5A, the spectral analysis apparatus 598 receives light from the output coupler 596.

The light-generation module 510 may include other components and systems. For example, the light-generation module 510 may include a beam preparation system 599. The beam preparation system 599 may include a pulse stretcher that stretches each pulse that interacts with the pulse stretcher in time. The beam preparation system also may include other components that are able to act upon light such as, for example, reflective and/or refractive optical elements (such as, for example, lenses and mirrors), and/or filters. In the example shown, the beam preparation system 599 is positioned in the path of the exposure beam 516. However, the beam preparation system 599 may be placed at other locations within the system 500.

The system 500 also includes the scanner apparatus 580. The scanner apparatus 580 exposes a wafer 582 with a shaped exposure beam 516A. The shaped exposure beam 516A is formed by passing the exposure beam 516 through a projection optical system 581. The scanner apparatus 580 may be a liquid immersion system or a dry system. The scanner apparatus 580 includes a projection optical system 581 through which the exposure beam 516 passes prior to reaching the wafer 582, and a sensor system or metrology system 570. The wafer 582 is held or received on a wafer holder 583. The scanner apparatus 580 also may include, for example, temperature control devices (such as air conditioning devices and/or heating devices), and/or power supplies for the various electrical components.

The metrology system 570 includes a sensor 571. The sensor 571 may be configured to measure a property of the shaped exposure beam 516A such as, for example, bandwidth, energy, pulse duration, and/or wavelength. The sensor 571 may be, for example, a camera or other device that is able to capture an image of the shaped exposure beam 516A at the wafer 582, or an energy detector that is able to capture data that describes the amount of optical energy at the wafer 582 in the x-y plane.

Referring also to FIG. 5B, the projection optical system 581 includes a slit 584, a mask 585, and a projection objective, which includes a lens system 586. The lens system 586 includes one or more optical elements. The exposure beam 516 enters the scanner apparatus 580 and impinges on the slit 584, and at least some of the output light beam 516 passes through the slit 584 to form the shaped exposure beam 516A. In the example of FIGS. 5A and 5B, the slit 584 is rectangular and shapes the exposure beam 516 into an elongated rectangular shaped light beam, which is the shaped exposure beam 516A. The mask 585 includes a pattern that determines which portions of the shaped light beam are transmitted by the mask 585 and which are blocked by the mask 585. Microelectronic features are formed on the wafer 582 by exposing a layer of radiation-sensitive photoresist material on the wafer 582 with the exposure beam 516A. The design of the pattern on the mask is determined by the specific microelectronic circuit features that are desired.

The configuration shown in FIG. 5A is an example of a configuration for a DUV system. Other implementations are possible. For example, the light-generation module 510 may include N instances of the optical oscillator 512, where N is an integer number greater than one. In these implementations, each optical oscillator 512 is configured to emit a respective light beam toward a beam combiner, which forms the exposure beam 516.

FIG. 6 shows another example configuration of a DUV system. FIG. 6 is a block diagram of a photolithography system 600 that includes a light-generation module 610 that produces a pulsed light beam 616, which is provided to the scanner apparatus 580. The light-generation module 610 is illustrated with the apparatus 130, but may be used with the apparatus 230, 330, or 430. The control system 550 is coupled to various components of the light-generation module 610 and the scanner apparatus 680 to control various operations of the system 600.

The light-generation module 610 is a two-stage laser system that includes a master oscillator (MO) 612_1 that provides the seed light beam 618 to a power amplifier (PA) 612_2. The PA 612_2 receives the seed light beam 618 from the MO 612_1 and amplifies the seed light beam 618 to generate the light beam 616 for use in the scanner apparatus 580. For example, in some implementations, the MO 612_1 may emit a pulsed seed light beam, with seed pulse energies of approximately 1 milliJoule (mJ) per pulse, and these seed pulses may be amplified by the PA 612_2 to about 6 to 15 mJ, but other energies may be used in other examples.

The MO 612_1 includes a discharge chamber 615_1 having two elongated electrodes 613a_1 and 613b_1, a gain medium 619_1 (shown with light dotted shading in FIG. 6) that is a gas mixture, and a fan (not shown) for circulating the gas mixture between the electrodes 613a_1, 613b_1. A resonator is formed between a line narrowing module 695 on one side of the discharge chamber 615_1 and an output coupler 696 on a second side of the discharge chamber 615_1.

The discharge chamber 615_1 includes a first chamber window 663_1 and a second chamber window 664_1. The first and second chamber windows 663_1 and 664_1 are on opposite sides of the discharge chamber 615_1. The first and second chamber windows 663_1 and 664_1 transmit light in the DUV range and allow DUV light to enter and exit the discharge chamber 615_1.

The line narrowing module 695 may include a diffractive optic such as a grating that finely tunes the spectral output of the discharge chamber 615_1. The light-generation module 610 also includes a line center analysis module 668 that receives an output light beam from the output coupler 696 and a beam coupling optical system 669. The line center analysis module 668 is a measurement system that may be used to measure or monitor the wavelength of the seed light beam 618. The line center analysis module 668 may be placed at other locations in the light-generation module 610, or it may be placed at the output of the light-generation module 610.

The gas mixture that is the gain medium 619_1 may be any gas suitable for producing a light beam at the wavelength and bandwidth required for the application. For an excimer source, the gas mixture may contain a noble gas (rare gas) such as, for example, argon or krypton, a halogen, such as, for example, fluorine or chlorine and traces of xenon apart from a buffer gas, such as helium. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. Thus, the light beams 616 and 618 include wavelengths in the DUV range in this implementation. The excimer gain medium (the gas mixture) is pumped with short (for example, nanosecond) current pulses in a high-voltage electric discharge by application of a voltage to the elongated electrodes 613*a*_1, 613*b*_1.

The PA 612_2 includes a beam coupling optical system 669 that receives the seed light beam 618 from the MO 612_1 and directs the seed light beam 618 through a discharge chamber 615_2, and to a beam turning optical element 692, which modifies or changes the direction of the seed light beam 618 so that it is sent back into the discharge chamber 615_2. The beam turning optical element 692 and the beam coupling optical system 669 form a circulating and closed loop optical path in which the input into a ring amplifier intersects the output of the ring amplifier at the beam coupling optical system 669.

The discharge chamber 615_2 includes a pair of elongated electrodes 613*a*_2, 613*b*_2, a gain medium 619_2 (shown with light dotted shading in FIG. 6), and a fan (not shown) for circulating the gain medium 619_2 between the electrodes 613*a*_2, 613*b*_2. The gas mixture that forms the gain medium 619_2 may be the same as the gas mixture that forms gain medium 619_1.

The discharge chamber 615_2 includes a first chamber window 663_2 and a second chamber window 664_2. The first and second chamber windows 663_2 and 664_2 are on opposite sides of the discharge chamber 615_2. The first and second chamber windows 663_2 and 664_2 transmit light in the DUV range and allow DUV light to enter and exit the discharge chamber 615_2.

When the gain medium 619_1 or 619_2 is pumped by creating a potential difference between the electrodes 613*a*_1, 613*b*_1 or 613*a*_2, 613*b*_2, respectively, the gain medium 619_1 and/or 619_2 emits light. The repetition rate of the pulses may range between about 500 and 6,000 Hz for various applications. In some implementations, the repetition rate may be greater than 6,000 Hz, and may be, for example, 12,000 Hz or greater, but other repetition rates may be used in other implementations.

The output light beam 616 may be directed through a beam preparation system 699 prior to reaching the scanner apparatus 580. The beam preparation system 699 may include a bandwidth analysis module that measures various parameters (such as the bandwidth or the wavelength) of the beam 616. The beam preparation system 699 also may include a pulse stretcher that stretches each pulse of the output light beam 616 in time. The beam preparation system 699 also may include other components that are able to act upon the beam 616 such as, for example, reflective and/or refractive optical elements (such as, for example, lenses and mirrors), filters, and optical apertures (including automated shutters).

The DUV light-generation module 610 also includes the gas management system 690, which is in fluid communication with an interior 678 of the DUV light-generation module 610.

Figure 7:
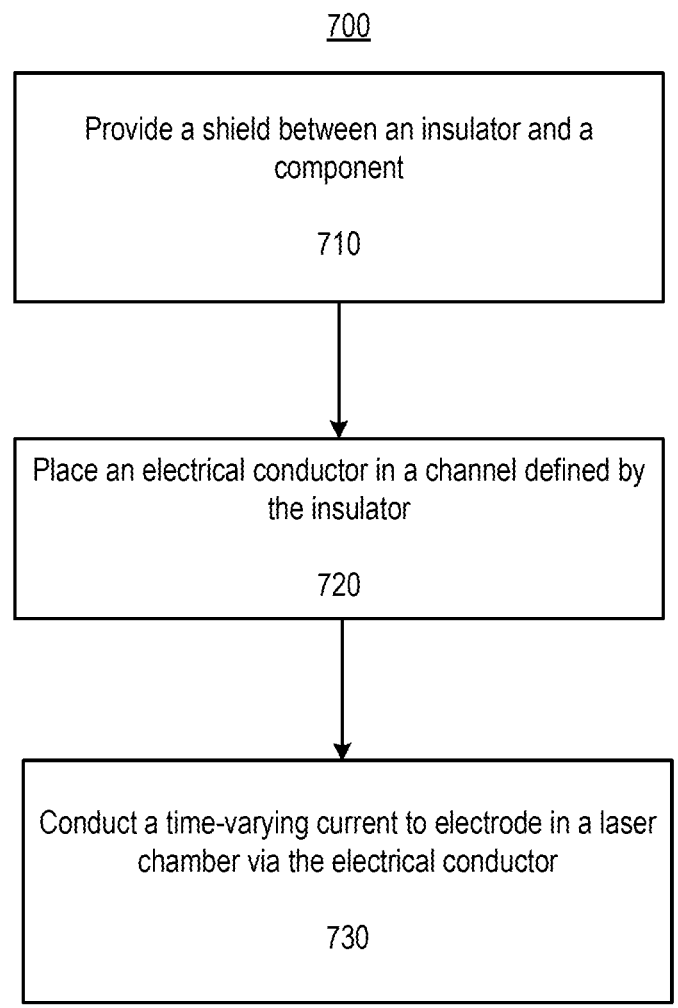
FIG. 7 is a flow chart of an example of a process for operating a light source.

FIG. 7 is a flow chart of a process 700. The process 700 is an example of a method of protecting a component in a light source and a method of operating a light source. The process 700 may be performed using any light source that includes one or more of the apparatuses 130, 230, 330, and 430. For example, the process 700 may be performed with the light source 110, the light-generation module 510, or the light-generation apparatus 610. The process 700 is discussed with respect to the light source 110 (FIG. 1A).

The shield 135 is provided between the insulator 131 and a component to be shielded (710). For example, the component to be shielded may be the gasket 133. The shield 135 is made of a material that inhibits or blocks magnetic fields. The insulator 131 defines the channel 132, which passes through the insulator 131.

The electrical conductor 151 is placed in the channel 132 (720). The electrical conductor 151 is electrically connected to the electrode 113*a* and to the power supply 197. The electrical conductor 151 is any type of device or structure that is capable of carrying electrical current. For example, the electrical conductor 151 may be, a cable or a thick copper wire.

The gas mixture 119 is provided to an interior of the chamber 115. For example, the light source 110 may be fluidly coupled to a gas supply (such as the gas supply 590 of FIG. 5A). The electrodes 113*a* and 113*b*, and at least a portion of the insulator 131 and the gasket 133 are also in the interior of the chamber 115.

The power supply 197 provides a time-varying current to the conductor 151, and the electrode 113*a* is charged (730). The time-varying current produces a time-varying magnetic field, as discussed above. However, the shield 135 surrounds the conductor 151 and the insulator 131 and blocks or attenuates the time-varying magnetic field. As a result, there is no or very little electric field in the vicinity of the gasket 133, and the gas mixture 119 and/or the gain medium in the gas mixture 119 and the gasket 133 is not exposed to a plasma of the gas mixture 119 and/or a plasma of the gain medium.

The implementations can be further described using the following clauses:

1. An apparatus for a light source, the apparatus comprising:
    an electrical insulator that defines a channel, the channel configured to receive an electrical conductor;
    a gasket that surrounds at least a portion of the electrical insulator, the gasket comprising a non-metallic material; and
    a shield between the channel and the gasket.
2. The apparatus of clause 1, wherein the shield is configured to reduce a magnetic field produced by an electrical current in the electrical conductor.
3. The apparatus of clause 2, wherein the shield is configured to block the magnetic field such that substantially no electric field is present near the gasket.
4. The apparatus of clause 1, wherein the shield comprises a magnetic metal.
5. The apparatus of clause 1, wherein the shield comprises a mu-metal.
6. The apparatus of clause 1, wherein the gasket comprises an elastomer material.
7. The apparatus of clause 1, wherein the electrical insulator comprises a base portion and a stem portion that extends from the base portion, and the channel passes through the stem portion and the base portion.
8. The apparatus of clause 7, wherein the shield surrounds a portion of an outer side of the stem portion.
9. The apparatus of clause 7, wherein the stem portion is a cylinder, the channel passes through the cylinder, and the base portion extends orthogonally from the stem portion.
10. The apparatus of clause 9, wherein the channel is concentric with the cylinder, and the base portion is concentric with the cylinder.

11. The apparatus of clause 1, wherein the electrical insulator is a substantially cylindrical body, and the shield surrounds a portion of an outer side of the cylindrical body.

12. The apparatus of clause 1, wherein the shield comprises a ferrite or an iron alloy.

13. A discharge chamber comprising:
    a housing;
    an electrode in the housing;
    an electrical conductor that passes through the housing and is electrically connected to the electrode;
    an electrical insulator that surrounds a portion of the electrical conductor;
    a gasket that surrounds the electrical insulator; and
    a shield around the electrical insulator, wherein the shield is configured to block or attenuate a magnetic field.

14. The discharge chamber of clause 13, wherein the shield is disposed between the electrical insulator and the gasket.

15. The discharge chamber of clause 13, wherein the gasket comprises an electrically insulating material.

16. The discharge chamber of clause 15, wherein the electrically insulating material comprises an elastomer.

17. The discharge chamber of clause 15, wherein the gasket comprises an O-ring.

18. The discharge chamber of clause 13, wherein the housing comprises an inner wall, and the inner wall comprises an electrically conductive material.

19. The discharge chamber of clause 13, further comprising a second electrode in the housing.

20. The discharge chamber of clause 19, wherein the housing contains a gaseous gain medium.

21. The discharge chamber of clause 20, wherein the gaseous gain medium comprises fluorine.

22. The discharge chamber of clause 21, wherein the gasket comprises a fluorinated material.

23. The discharge chamber of clause 13, wherein the shield is configured to block or attenuate a transient magnetic field produced by a time-varying electrical current that flows in the electrical conductor.

24. The discharge chamber of clause 13, wherein the chamber comprises:
    N electrical insulators;
    N gaskets; and
    N electrical conductors, wherein
    N is an integer number greater than one,
    each of the N electrical insulators surrounds one of the electrical conductors, each of the N gaskets surrounds one of the N electrical insulators, and
    at least one of the N gaskets is entirely metallic.

25. The discharge chamber of clause 13, wherein the discharge chamber is configured for use in a deep ultraviolet (DUV) light source.

26. The discharge chamber of clause 13, wherein the gasket is in a groove, and the shield is between the electrical insulator and the groove.

27. A deep ultraviolet (DUV) light source comprising:
    a first chamber configured to produce a first pulsed DUV light beam, the first chamber comprising:
        a first housing;
        a first electrode assembly in the first housing;
        a first insulator comprising a first channel configured to receive a first electrical conductor, wherein the first electrical conductor is configured to electrically connect to the first electrode assembly;
        a first gasket that surrounds a portion of the first insulator; and
        a first shield that surrounds a portion of the first channel, wherein the first shield is configured to block or attenuate magnetic fields.

28. The DUV light source of clause 27, further comprising a second chamber configured to produce a second pulsed DUV light beam, the second chamber comprising:
    a second housing;
    a second electrode assembly in the second housing;
    a second insulator comprising a second channel configured to receive a second electrical conductor, wherein the second electrical conductor is configured to electrically connect to the second electrode assembly;
    a second gasket that surrounds a portion of the second insulator; and
    a second shield that surrounds a portion of the second channel, wherein the first shield is configured to block or attenuate magnetic fields.

29. The DUV light source of clause 28, wherein the first shield is concentric with the first gasket, and the second shield is concentric with the second gasket.

30. The DUV light source of clause 28, wherein the first pulsed light beam comprises a seed light beam, the second chamber is positioned to receive the seed light beam, and the second pulsed light beam is based on the seed light beam.

31. The DUV light source of clause 28, wherein the first pulsed light beam and the second pulsed light beam are emitted toward a common beam combiner.

32. The DUV light source of clause 30, wherein the first gasket and the second gasket comprise an elastomer material.

33. The DUV light source of clause 28, wherein the first electrode assembly comprises a first anode and a first cathode, and the first electrical conductor is configured to electrically connect to the first cathode.

34. The DUV light source of clause 30, wherein
    the first electrode assembly comprises a first anode and a first cathode, and the first electrical conductor is configured to electrically connect to the first cathode; and
    the second electrode assembly comprises a second anode and a second cathode, and the second electrical conductor is configured to electrically connect to the second cathode.

35. The DUV light source of clause 27, further comprising a power supply external to the first housing, wherein the power supply is configured to electrically connect to the electrical conductor, and, in operational use, the power supply provides a high-voltage excitation pulse to the electrical conductor.

36. The DUV light source of clause 28, wherein the first shield is concentrically disposed between the first gasket and the first insulator and the second shield is disposed concentrically between the second gasket and the first insulator.

37. A method of operating a laser, the method comprising:
    providing a shield between an insulator and a component, wherein the insulator passes through a wall of a discharge chamber of the laser and the insulator defines a channel;
    placing an electrical conductor in the channel; and
    conducting a time-varying current in the electrical conductor to charge an electrode in the discharge chamber of the laser, wherein the shield blocks a magnetic field formed around the electrical conductor such that substantially no electric field is present near the component.

38. The method of clause 37, wherein the component comprises an elastomer gasket.

39. The method of clause 37, further comprising:
providing a gaseous gain medium to the discharge chamber, wherein
the component is a gasket configured to seal the chamber and prevent the gaseous gain medium from escaping the chamber; and
the shield blocks a magnetic field formed around the electrical conductor such that substantially no electric field is present near the component and substantially no plasma of the gaseous gain medium is formed at the component.

40. A light source comprising:
a discharge chamber;
an electrode in the discharge chamber;
an electrically insulating structure comprising:
a base portion in the discharge chamber, wherein the base portion extends between the electrode and an external wall of the discharge chamber; and
a plurality of stem portions extending from the base portion and through the external wall of the discharge chamber, wherein each stem portion comprises a channel that passes through the stem portion and the base portion, and each channel is configured to receive an electrical conductor that electrically connects to the electrode;
a plurality of gaskets, wherein each gasket surrounds one of the stem portions, and at least one of the gaskets comprises a non-metallic material that surrounds a respective one of the stem portions; and
a shield disposed between each of the at least one non-metallic gaskets and the respective one of the stem portions.

41. The light source of clause 40, wherein the plurality of gaskets comprises at least one metallic gasket, and each of the at least one metallic gaskets surrounds a respective one of the stem portions without a shield between the metallic gasket and the respective one of the stem portions.

These and other implementations are within the scope of the claims.

The invention claimed is:

1. An apparatus for a light source, the apparatus comprising:
an electrical insulator that defines a channel, the channel configured to receive an electrical conductor;
a gasket that surrounds at least a portion of the electrical insulator, the gasket comprising a non-metallic material; and
a shield between the channel and the gasket.

2. The apparatus of claim 1, wherein the shield is configured to reduce a magnetic field produced by an electrical current in the electrical conductor.

3. The apparatus of claim 1, wherein the shield comprises a magnetic metal.

4. The apparatus of claim 1, wherein the shield comprises a mu-metal and the gasket comprises an elastomer material.

5. The apparatus of claim 1, wherein the electrical insulator comprises a base portion and a stem portion that extends from the base portion, and the channel passes through the stem portion and the base portion, wherein the shield surrounds a portion of an outer side of the stem portion.

6. The apparatus of claim 1, wherein the shield comprises a ferrite or an iron alloy.

7. The apparatus of claim 1, wherein the shield comprises a cylindrical portion.

8. The apparatus of claim 7, wherein the shield comprises a flange that extends radially outward from the cylindrical portion.

9. The apparatus of claim 8, wherein the cylindrical portion and the channel extend in a first direction.

10. A discharge chamber comprising:
a housing;
an electrode in the housing;
an electrical conductor that passes through the housing in a first direction and is electrically connected to the electrode;
an electrical insulator that surrounds a portion of the electrical conductor;
a gasket that surrounds the electrical insulator; and
a shield around the electrical insulator, wherein the shield extends along the first direction and is configured to attenuate a magnetic field.

11. The discharge chamber of claim 10, wherein the shield is disposed between the electrical insulator and the gasket.

12. The discharge chamber of claim 10, wherein the gasket comprises an electrically insulating material.

13. The discharge chamber of claim 10, wherein the housing comprises an inner wall, and the inner wall comprises an electrically conductive material.

14. The discharge chamber of claim 10, further comprising a second electrode in the housing and wherein the housing contains a gaseous gain medium.

15. The discharge chamber of claim 14, wherein the gaseous gain medium comprises fluorine and the gasket comprises a fluorinated material.

16. The discharge chamber of claim 10, wherein the chamber comprises:
N electrical insulators;
N gaskets; and
N electrical conductors, wherein
N is an integer number greater than one,
each of the N electrical insulators surrounds one of the N electrical conductors, each of the N gaskets surrounds one of the N electrical insulators, and
at least one of the N gaskets is entirely metallic.

17. The discharge chamber of claim 10, wherein the gasket is in a groove, and the shield is between the electrical insulator and the groove.

18. The apparatus of claim 10, wherein the shield is configured to block the magnetic field.

19. A deep ultraviolet (DUV) light source comprising:
a first chamber configured to produce a first pulsed DUV light beam, the first chamber comprising:
a first housing;
a first electrode assembly in the first housing;
a first insulator comprising a first channel extending along a first direction and configured to receive a first electrical conductor, wherein the first electrical conductor is configured to electrically connect to the first electrode assembly;
a first gasket that surrounds a portion of the first insulator; and
a first shield that surrounds a portion of the first channel and extends along the first direction, wherein the first shield is configured to attenuate magnetic fields.

20. The DUV light source of claim 19, further comprising a second chamber configured to produce a second pulsed DUV light beam, the second chamber comprising:
a second housing;
a second electrode assembly in the second housing;
a second insulator comprising a second channel configured to receive a second electrical conductor, wherein the second electrical conductor is configured to electrically connect to the second electrode assembly;

a second gasket that surrounds a portion of the second insulator; and a second shield that surrounds a portion of the second channel, wherein the first shield is configured to attenuate magnetic fields.

21. The DUV light source of claim 20, wherein the first pulsed DUV light beam comprises a seed light beam, the second chamber is positioned to receive the seed light beam, and the second pulsed DUV light beam is based on the seed light beam.

22. The DUV light source of claim 20, wherein the first pulsed DUV light beam and the second pulsed DUV light beam are emitted toward a common beam combiner.

23. The DUV light source of claim 20, wherein the first electrode assembly comprises a first anode and a first cathode, and the first electrical conductor is configured to electrically connect to the first cathode.

24. The DUV light source of claim 20, wherein the first shield is concentrically disposed between the first gasket and the first insulator and the second shield is disposed concentrically between the second gasket and the first insulator.

25. The deep ultraviolet (DUV) light source of claim 20, wherein the first shield and the second shield are configured to block magnetic fields.

26. The deep ultraviolet (DUV) light source of claim 20, wherein the second channel and the second shield extend along the first direction.

27. A discharge chamber comprising:

a housing;

an electrode in the housing;

an electrical conductor that passes through the housing and is electrically connected to the electrode;

an electrical insulator that surrounds a portion of the electrical conductor;

a gasket that surrounds the electrical insulator; and a shield around the electrical insulator, wherein the shield is configured to block or attenuate a magnetic field, and the shield is disposed between the electrical insulator and the gasket.

28. A discharge chamber comprising:

a housing;

an electrode in the housing;

an electrical conductor that passes through the housing and is electrically connected to the electrode;

an electrical insulator that surrounds a portion of the electrical conductor;

a gasket that surrounds the electrical insulator; and a shield around the electrical insulator, wherein the shield is configured to block or attenuate a magnetic field; and the gasket is in a groove, and the shield is between the electrical insulator and the groove.

29. A light source comprising:

a discharge chamber;

an electrode in the discharge chamber;

an electrically insulating structure comprising:

a base portion in the discharge chamber, wherein the base portion extends between the electrode and an external wall of the discharge chamber; and a plurality of stem portions extending from the base portion and through the external wall of the discharge chamber, wherein each stem portion comprises a channel that passes through the stem portion and the base portion, and each channel is configured to receive an electrical conductor that electrically connects to the electrode;

a plurality of gaskets, wherein each gasket surrounds one of the stem portions, and the plurality of gaskets comprises at least one non-metallic gasket that comprises a non-metallic material that surrounds a respective one of the stem portions; and a shield disposed between each of the at least one non-metallic gaskets and the respective one of the stem portions, wherein the plurality of gaskets comprises at least one metallic gasket, and each of the at least one metallic gaskets surrounds a respective one of the stem portions without a shield between the metallic gasket and the respective one of the stem portions.

* * * * *

UNITED STATES PATENT AND TRADEMARK OFFICE
CERTIFICATE OF CORRECTION

| | | |
|---|---|---|
| PATENT NO. | : 12,245,409 B2 | Page 1 of 1 |
| APPLICATION NO. | : 18/026874 | |
| DATED | : March 4, 2025 | |
| INVENTOR(S) | : Mohammad Amin Khamehchi et al. | |

It is certified that error appears in the above-identified patent and that said Letters Patent is hereby corrected as shown below:

On the Title Page

Applicant section: "Cymer, LLC." should read --Cymer, LLC-- therefor.

In the Claims

In Column 20, Claim 18: "The apparatus of claim 10, wherein the shield is configured to block the magnetic field." should read --The discharge chamber of claim 10, wherein the shield is configured to block the magnetic field.-- therefor.

Signed and Sealed this
Tenth Day of June, 2025

Coke Morgan Stewart
*Acting Director of the United States Patent and Trademark Office*